(12) United States Patent
Flynn et al.

(10) Patent No.: US 12,143,646 B2
(45) Date of Patent: *Nov. 12, 2024

(54) METHODS AND DEVICES USING DIRECT CODING IN POINT CLOUD COMPRESSION

(71) Applicant: BlackBerry Limited, Waterloo (CA)

(72) Inventors: David Flynn, Darmstadt (DE);
Sébastien Lasserre, Thorigné-Fouillard (FR)

(73) Assignee: BlackBerry Limited, Waterloo (CA)

( * ) Notice: Subject to any disclaimer, the term of this patent is extended or adjusted under 35 U.S.C. 154(b) by 0 days.

This patent is subject to a terminal disclaimer.

(21) Appl. No.: 18/145,908

(22) Filed: Dec. 23, 2022

(65) Prior Publication Data

US 2023/0126256 A1 Apr. 27, 2023

Related U.S. Application Data

(63) Continuation of application No. 16/955,279, filed as application No. PCT/CA2019/050036 on Jan. 10, 2019, now Pat. No. 11,570,481.

(30) Foreign Application Priority Data

Jan. 18, 2018 (EP) ..................... 18305038

(51) Int. Cl.
*H04N 19/91* (2014.01)
*G06T 9/00* (2006.01)
(Continued)

(52) U.S. Cl.
CPC ............. *H04N 19/91* (2014.11); *G06T 9/001* (2013.01); *G06T 9/40* (2013.01); *H03M 7/405* (2013.01); *H03M 7/6094* (2013.01); *H04N 19/96* (2014.11)

(58) Field of Classification Search
CPC ........ H04N 19/91; H04N 19/96; G06T 9/001; G06T 9/40; G06T 9/00; H03M 7/405; H03M 7/6094; H03M 7/40
See application file for complete search history.

(56) References Cited

U.S. PATENT DOCUMENTS 11,361,472 B2 6/2022 Lasserre
2003/0214502 A1 11/2003 Park et al.
(Continued)

FOREIGN PATENT DOCUMENTS

CN 103814396 A 5/2014
CN 104682966 A 6/2015
(Continued)

OTHER PUBLICATIONS

EP Application No. 18305038.4; Extened European Search Report dated Jul. 18, 2020.
(Continued)

*Primary Examiner* — Richard T Torrente
(74) *Attorney, Agent, or Firm* — Rowand LLP

(57) ABSTRACT

Methods and devices for coding point clouds using direct coding mode to code coordinates of a point within a sub-volume associated with a current node instead of a pattern of occupancy for child nodes. Eligibility for use of direct coding is based on occupancy data from another node. If eligible, then a flag is represented in the bitstream to signal whether direct coding is applied to points in the sub-volume or not.

18 Claims, 7 Drawing Sheets

(51) Int. Cl.
*G06T 9/40* (2006.01)
*H03M 7/30* (2006.01)
*H03M 7/40* (2006.01)
*H04N 19/96* (2014.01)

(56) References Cited

U.S. PATENT DOCUMENTS

| | | | |
|---|---|---|---|
| 2010/0085352 | A1 | 4/2010 | Zhou et al. |
| 2015/0358631 | A1* | 12/2015 | Zhang ................. H04N 19/176 375/240.16 |
| 2017/0214943 | A1* | 7/2017 | Cohen .................... H04N 19/62 |
| 2017/0347122 | A1 | 11/2017 | Chou et al. |
| 2022/0191532 | A1* | 6/2022 | Wang ........................ G06T 9/40 |

FOREIGN PATENT DOCUMENTS

| | | |
|---|---|---|
| EP | 3514969 | 7/2019 |
| EP | 3595180 | 1/2020 |
| WO | 2011103679 A1 | 9/2011 |

OTHER PUBLICATIONS

Joaquim Salvi et al; 'Pattern codification strategies in structured light systems'; Institut d'Informatica i Aplicacions, Universitat de Girona, Av. Liuis Santalo, sin, E-17071 Girona, Spain, Received Mar. 6, 2003; accepted Oct. 2, 2003.

Julius Kammerl et al; 'Real-time Compression of Point Cloud Streams'; Inelligent Autonomous Systems Group, Technische Universitat Munchen, Munich, Germany; Willow Garage, Inc. Menlo Park, CA, USA; May 14-18, 2012.

CNIPA: CN Office Action relating to CN application No. 201980009025.9, dated May 6, 2023.

USPTO: US Office Action relating to U.S. Appl. No. 17/798,205, dated Mar. 15, 2024.

KR Application No. 10-2020-7023062; Office Action dated Jun. 17, 2024.

Joaquim Salvi et al.; 'Pattern Codification Strategies In Structured Light Systems'; Institute d'Informatica i Aplicacions, Universitat de Girona, Av. Lluis Santalo, s/n, E-17071 Girona, Spain; Received Mar. 6, 2023; accepted Oct. 2, 2003.

Cha Zhang et al; 'Point Cloud Attribute Compression With Graph Transform'; Microsoft Research; One Microsoft Way, Redmond, WA 98075.

EP Office Action dated Jul. 4, 2024; EP Application No. 20707206.7.

Schwarz, Sebastian, et al. "Emerging MPEG standards for point cloud compression." IEEE Journal on Emerging and Selected Topics in Circuits and Systems 9.1 (2018): 133-148.

Cao, Chao, Marius Preda, and Titus Zaharia. "3D point cloud compression: a Survey." Proceedings of the 24th International Conferenced on 3D Web Technology, 2019.

U.S. Office Action dated Jul. 18, 2024; U.S. Appl. No. 17/771,196.

* cited by examiner

METHODS AND DEVICES USING DIRECT CODING IN POINT CLOUD COMPRESSION

CROSS-REFERENCE TO RELATED APPLICATIONS

The present application is a continuation of application Ser. No. 16/955,279, which entered national phase in the United States from PCT application no. PCT/CA2019/050036, filed Jan. 10, 2019, which claims priority to EP application no. 18305038.4, filed Jan. 18, 2018, all of which are hereby incorporated by reference.

FIELD

The present application generally relates to point cloud compression and, in particular to methods and devices for improved compression of point clouds using inferred direct coding of sparsely-populated volumes.

BACKGROUND

Data compression is used in communications and computer networking to store, transmit, and reproduce information efficiently. There is an increasing interest in representations of three-dimensional objects or spaces, which can involve large datasets and for which efficient and effective compression would be highly useful and valued. In some cases, three-dimensional objects or spaces may be represented using a point cloud, which is a set of points each having a three coordinate location (X, Y, Z) and, in some cases, other attributes like colour data (e.g. luminance and chrominance), transparency, reflectance, normal vector, etc. Point clouds can be static (a stationary object or a snapshot of an environment/object at a single point in time) or dynamic (a time-ordered sequence of point clouds).

Example applications for point clouds include topography and mapping applications. Autonomous vehicle and other machine-vision applications may rely on point cloud sensor data in the form of 3D scans of an environment, such as from a LiDAR scanner. Virtual reality simulations may rely on point clouds.

It will be appreciated that point clouds can involve large quantities of data and compressing (encoding and decoding) that data quickly and accurately is of significant interest. Accordingly, it would be advantageous to provide for methods and devices that more efficiently and/or effectively compress data for point clouds.

BRIEF DESCRIPTION OF THE DRAWINGS

Reference will now be made, by way of example, to the accompanying drawings which show example embodiments of the present application, and in which.

Similar reference numerals may have been used in different figures to denote similar components.

DESCRIPTION OF EXAMPLE EMBODIMENTS

Figure 1:
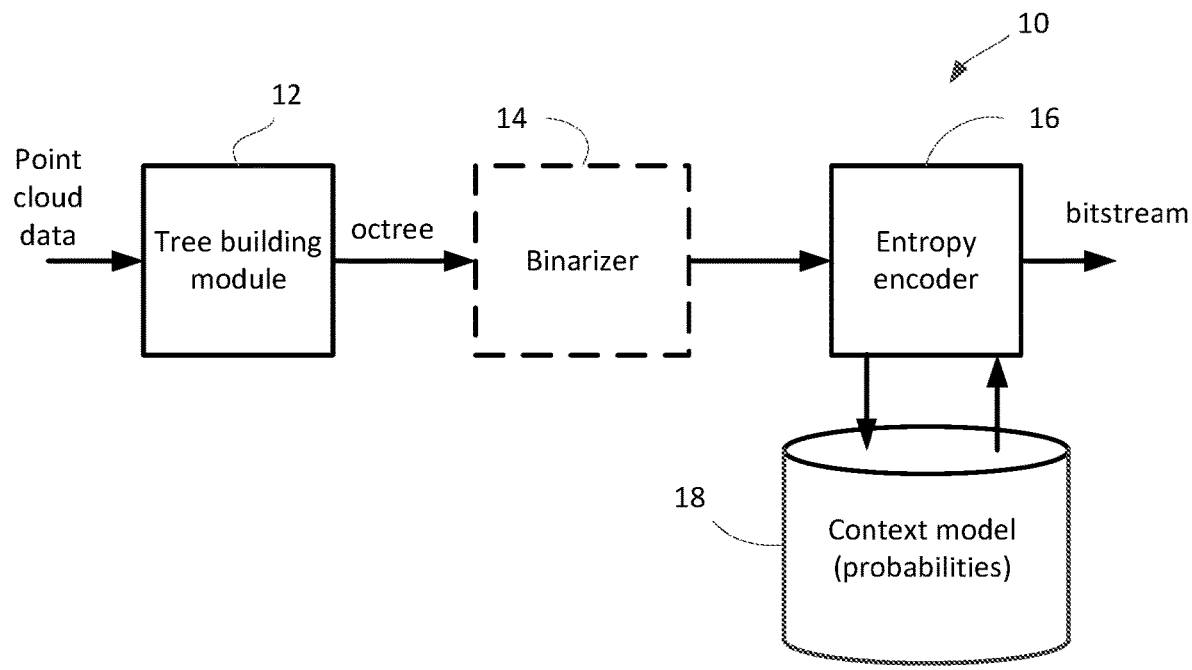
FIG. 1 shows a simplified block diagram of an example point cloud encoder.

The present application describes methods of encoding and decoding point clouds, and encoders and decoders for encoding and decoding point clouds. In general the present application describes methods and devices for coding point clouds using direct coding mode to code coordinates of a point within a sub-volume associated with a current node instead of a pattern of occupancy for child nodes. Eligibility for use of direct coding is based on occupancy data from another node. The another node is a previously-coded node, such as a sibling to the current node or a neighbouring node of the current node. The another node may be a plurality of neighboring nodes. If eligible, then a flag is represented in the bitstream to signal whether direct coding is applied to points in the sub-volume or not.

In one aspect, the present application describes a method of encoding a point cloud to generate a bitstream of compressed point cloud data, the point cloud being defined in a tree structure having a plurality of nodes having parent-child relationships and that represent the geometry of a volumetric space recursively split into sub-volumes and containing the points of the point cloud. The method includes traversing the tree to entropy encode patterns of occupancy for sets of child nodes, wherein a pattern of occupancy indicates which of the sub-volumes associated with the respective child nodes contain at least one point. The traversing includes, for a current node associated with a sub-volume, determining, based on occupancy data from another node, that points within the sub-volume associated with the current node are eligible for direct coding; determining, based on the number of points within the sub-volume associated with the current node, that direct coding is to be applied; inserting a flag in the bitstream indicating the direct coding is to be applied in association with the current node; and entropy encoding positional coordinate data for at least some of the points within the sub-volume.

In another aspect, the present application describes a method of decoding a bitstream of compressed point cloud data to produce a reconstructed point cloud, the point cloud being defined in a tree structure having a plurality of nodes having parent-child relationships and that represent the geometry of a volumetric space recursively split into sub-volumes and containing the points of the point cloud. The method includes traversing the tree to entropy decode patterns of occupancy for sets of child nodes, wherein a pattern of occupancy indicates which of the sub-volumes associated with the respective child nodes contain at least one point. Traversing includes, for a current node associated with a sub-volume, determining, based on occupancy data from another node, that points within the sub-volume associated with the current node are eligible for direct coding; decoding a flag from the bitstream, wherein the decoded flag indicates that direct coding was used for the current node; and based on the decoded flag, entropy decoding positional coordinate data for points within the sub-volume.

In some implementations, determining that the current node is eligible for direct coding includes determining eligibility based on occupancy data for a parent node to the current node. In some cases, occupancy data for the parent node includes whether sibling nodes to the current node are occupied.

In some implementations, determining that the current node is eligible for direct coding includes determining eligibility based on occupancy status of neighbouring nodes to the current node. In some examples, neighboring nodes are nodes that are associated with respective sub-volumes that share at least one face with the sub-volume associated with the current node. In some further examples, neighboring nodes are nodes that are associated with respective sub-volumes that share at least one edge with the sub-volume associated with the current node. In yet further examples, neighboring nodes are nodes that are associated with respective sub-volumes that share at least one vertex with the sub-volume associated with the current node.

In some implementations, determining that the current node is eligible for direct coding includes determining eligibility based on occupancy data for a grandparent node to the current node. In some cases, occupancy data for the grandparent node includes whether sibling nodes to a parent node to the current node are occupied.

In a further aspect, the present application describes encoders and decoders configured to implement such methods of encoding and decoding.

In yet a further aspect, the present application describes non-transitory computer-readable media storing computer-executable program instructions which, when executed, cause one or more processors to perform the described methods of encoding and/or decoding.

In yet another aspect, the present application describes a computer-readable signal containing program instructions which, when executed by a computer, cause the computer to perform the described methods of encoding and/or decoding.

Other aspects and features of the present application will be understood by those of ordinary skill in the art from a review of the following description of examples in conjunction with the accompanying figures.

At times in the description below, the terms "node" and "sub-volume" may be used interchangeably. It will be appreciated that a node is associated with a sub-volume. The node is a particular point on the tree that may be an internal node or a leaf node. The sub-volume is the bounded physical space that the node represents. The term "volume" may be used to refer to the largest bounded space defined for containing the point cloud. The volume is recursively divided into sub-volumes for the purpose of building out a tree-structure of interconnected nodes for coding the point cloud data.

In the present application, the term "and/or" is intended to cover all possible combinations and sub-combinations of the listed elements, including any one of the listed elements alone, any sub-combination, or all of the elements, and without necessarily excluding additional elements.

In the present application, the phrase "at least one of . . . or . . . " is intended to cover any one or more of the listed elements, including any one of the listed elements alone, any sub-combination, or all of the elements, without necessarily excluding any additional elements, and without necessarily requiring all of the elements.

A point cloud is a set of points in a three-dimensional coordinate system. The points are often intended to represent the external surface of one or more objects. Each point has a location (position) in the three-dimensional coordinate system. The position may be represented by three coordinates (X, Y, Z), which can be Cartesian or any other coordinate system. The points may have other associated attributes, such as colour, which may also be a three component value in some cases, such as R, G, B or Y, Cb, Cr. Other associated attributes may include transparency, reflectance, a normal vector, etc., depending on the desired application for the point cloud data.

Point clouds can be static or dynamic. For example, a detailed scan or mapping of an object or topography may be static point cloud data. The LiDAR-based scanning of an environment for machine-vision purposes may be dynamic in that the point cloud (at least potentially) changes over time, e.g. with each successive scan of a volume. The dynamic point cloud is therefore a time-ordered sequence of point clouds.

Point cloud data may be used in a number of applications, including conservation (scanning of historical or cultural objects), mapping, machine vision (such as autonomous or semi-autonomous cars), and virtual reality system, to give some examples. Dynamic point cloud data for applications like machine vision can be quite different from static point cloud data like that for conservation purposes. Automotive vision, for example, typically involves relatively small resolution, non-coloured, highly dynamic point clouds obtained through LiDAR (or similar) sensors with a high frequency of capture. The objective of such point clouds is not for human consumption or viewing but rather for machine object detection/classification in a decision process. As an example, typical LiDAR frames contain on the order of tens of thousands of points, whereas high quality virtual reality applications require several millions of points. It may be expected that there will be a demand for higher resolution data over time as computational speed increases and new applications are found.

While point could data is useful, a lack of effective and efficient compression, i.e. encoding and decoding processes, may hamper adoption and deployment.

One of the more common mechanism for coding point cloud data is through using tree-based structures. In a tree-based structure, the bounding three-dimensional volume for the point cloud is recursively divided into sub-volumes. Nodes of the tree correspond to sub-volumes. The decision of whether or not to further divide a sub-volume may be based on resolution of the tree and/or whether there are any points contained in the sub-volume. A leaf node may have an occupancy flag that indicates whether its associated sub-volume contains a point or not. Splitting flags may signal whether a node has child nodes (i.e. whether a current volume has been further split into sub-volumes). These flags may be entropy coded in some cases and in some cases predictive coding may be used.

A commonly-used tree structure is an octree. In this structure, the volumes/sub-volumes are all cubes and each split of a sub-volume results in eight further sub-volumes/sub-cubes. Another commonly-used tree structure is a KD-tree, in which a volume (cube or rectangular cuboid) is recursively divided in two by a plane orthogonal to one of the axes. Octrees are a special case of KD-trees, where the volume is divided by three planes, each being orthogonal to one of the three axes. Both these examples relate to cubes or rectangular cuboids; however, the present application is not restricted to such tree structures and the volumes and sub-volumes may have other shapes in some applications. The division of a volume is not necessarily into two sub-volumes (KD-tree) or eight sub-volumes (octree), but could involve other divisions, including division into non-rectangular shapes or involving non-adjacent sub-volumes.

The present application may refer to octrees for ease of explanation and because they are a popular candidate tree structure for automotive applications, but it will be understood that the methods and devices described herein may be implemented using other tree structures.

Reference is now made to FIG. 1, which shows a simplified block diagram of a point cloud encoder 10 in accordance with aspects of the present application. The point cloud encoder 10 includes a tree building module 12 for receiving point cloud data and producing a tree (in this example, an octree) representing the geometry of the volumetric space containing point cloud and indicating the location or position of points from the point cloud in that geometry.

The basic process for creating an octree to code a point cloud may include:
1. Start with a bounding volume (cube) containing the point cloud in a coordinate system
2. Split the volume into 8 sub-volumes (eight sub-cubes)
3. For each sub-volume, mark the sub-volume with 0 if the sub-volume is empty, or with 1 if there is at least one point in it
4. For all sub-volumes marked with 1, repeat (2) to split those sub-volumes, until a maximum depth of splitting is reached
5. For all leaf sub-volumes (sub-cubes) of maximum depth, mark the leaf cube with 1 if it is non-empty, 0 otherwise The above process might be described as an occupancy-equals-splitting process, where splitting implies occupancy, with the constraint that there is a maximum depth or resolution beyond which no further splitting will occur. This this case, a single flag signals whether a node is split and hence whether it is occupied by at least one point, and vice versa. At the maximum depth, the flag signals occupancy, with no further splitting possible.

In some implementations, splitting and occupancy are independent such that a node may be occupied and may or may not be split. There are two variations of this implementation:
1. Split-then-occupied. A signal flag indicates whether a node is split. If split, then the node must contain a point—that is splitting implies occupancy. Otherwise, if the node is not to be split then a further occupancy flag signals whether the node contains at least one point. Accordingly, when a node is not further split, i.e. it is a leaf node, the leaf node must have an associated occupancy flag to indicate whether it contains any points.
2. Occupied-then-split. A single flag indicates whether the node is occupied. If not occupied, then no splitting occurs. If it is occupied, then a splitting flag is coded to indicate whether the node is further split or not.

Irrespective of which of the above-described processes is used to build the tree, it may be traversed in a pre-defined order (breadth-first or depth-first, and in accordance with a scan pattern/order within each divided sub-volume) to produce a sequence of bits from the flags (occupancy and/or splitting flags). This may be termed the serialization or binarization of the tree. As shown in FIG. 1, in this example, the point cloud encoder 10 includes a binarizer 14 for binarizing the octree to produce a bitstream of binarized data representing the tree.

This sequence of bits may then be encoded using an entropy encoder 16 to produce a compressed bitstream. The entropy encoder 16 may encode the sequence of bits using a context model 18 that specifies probabilities for coding bits based on a context determination by the entropy encoder 16. The context model 18 may be adaptively updated after coding of each bit or defined set of bits. The entropy encoder 16 may, in some cases, be a binary arithmetic encoder. The binary arithmetic encoder may, in some implementations, employ context-adaptive binary arithmetic coding (CABAC). In some implementations, coders other than arithmetic coders may be used.

In some cases, the entropy encoder 16 may not be a binary coder, but instead may operate on non-binary data. The output octree data from the tree building module 12 may not be evaluated in binary form but instead may be encoded as non-binary data. For example, in the case of an octree, the eight flags within a sub-volume (e.g. occupancy flags) in their scan order may be considered a $2^8-1$ bit number (e.g. an integer having a value between 1 and 255 since the value 0 is not possible for a split sub-volume, i.e. it would not have been split if it was entirely unoccupied). This number may be encoded by the entropy encoder using a multi-symbol arithmetic coder in some implementations. Within a sub-volume, e.g. a cube, the sequence of flags that defines this integer may be termed a "pattern".

Like with video or image coding, point cloud coding can include predictive operations in which efforts are made to predict the pattern for a sub-volume, and the residual from the prediction is coded instead of the pattern itself. Predictions may be spatial (dependent on previously coded sub-volumes in the same point cloud) or temporal (dependent on previously coded point clouds in a time-ordered sequence of point clouds).

Figure 2:
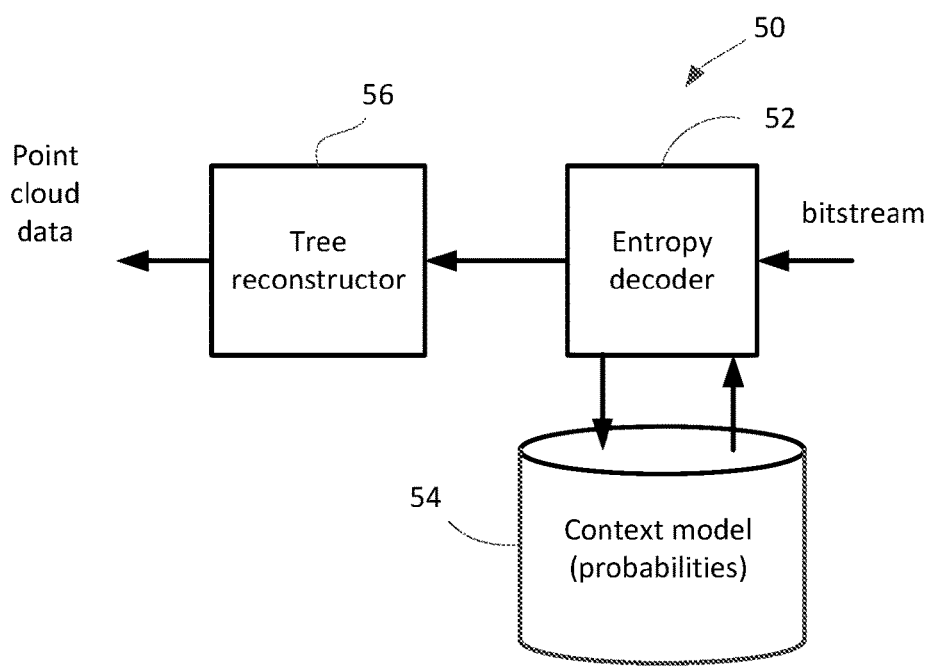
FIG. 2 shows a simplified block diagram of an example point cloud decoder.

A block diagram of an example point cloud decoder 50 that corresponds to the encoder 10 is shown in FIG. 2. The point cloud decoder 50 includes an entropy decoder 52 using the same context model 54 used by the encoder 10. The entropy decoder 52 receives the input bitstream of compressed data and entropy decodes the data to produce an output sequence of decompressed bits. The sequence is then converted into reconstructed point cloud data by a tree reconstructor 56. The tree reconstructor 56 rebuilds the tree structure from the decompressed data and knowledge of the scanning order in which the tree data was binarized. The tree reconstructor 56 is thus able to reconstruct the location of the points from the point cloud (subject to the resolution of the tree coding).

Figure 3:
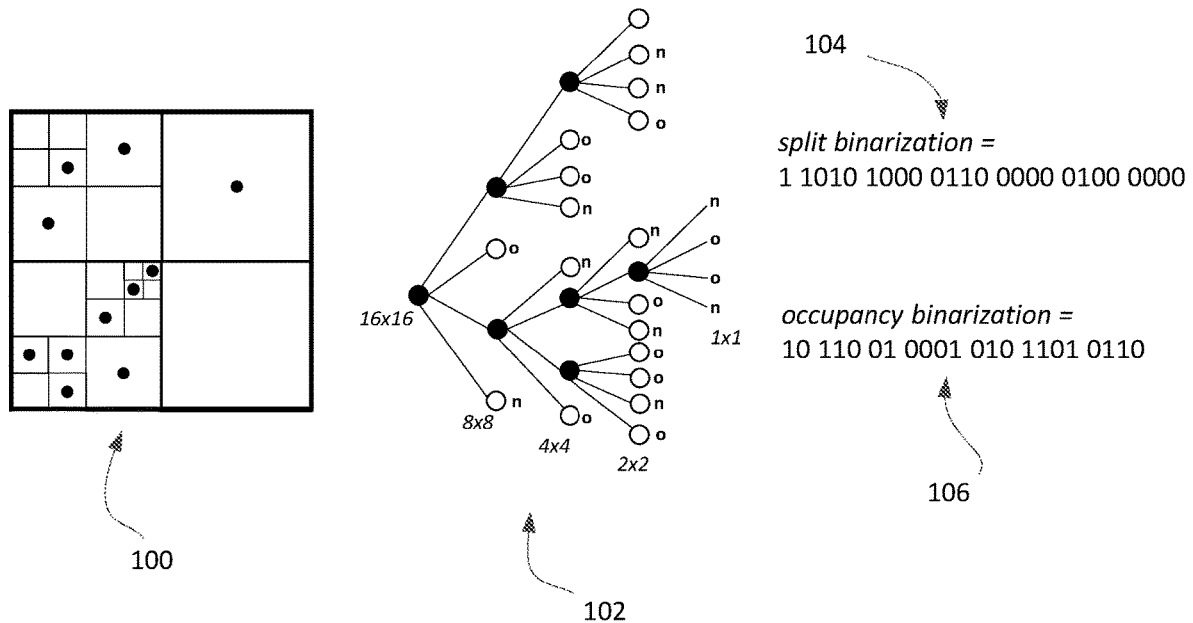
FIG. 3 shows an example partial sub-volume and associated tree structure for coding.

An example partial sub-volume 100 is shown in FIG. 3. In this example, a slice of the sub-volume 100 is shown in two-dimensions for ease of illustration, and the size of the sub-volume 100 is 16×16. It will be noted that the sub-volume has been divided into four 8×8 sub-squares, and two of those have been further subdivided into 4×4 sub-squares, three of which are further divided to 2×2 sub-squares, and one of the 2×2 sub-square is then divided into 1×1 squares. The 1×1 squares are the maximum depth of the tree and represent the finest resolution for positional point data. The points from the point cloud are shown as dots in the figure.

The structure of the tree 102 is shown to the right of the sub-volume 100. The sequence of splitting flags 104 and the corresponding sequence of occupancy flags 106, obtained in a pre-defined breadth-first scan order, is shown to the right of the tree 102. It will be observed that in this illustrative example, there is an occupancy flag for each sub-volume (node) that is not split, i.e. that has an associated splitting flag set to zero. These sequences may be entropy encoded.

Figure 4:
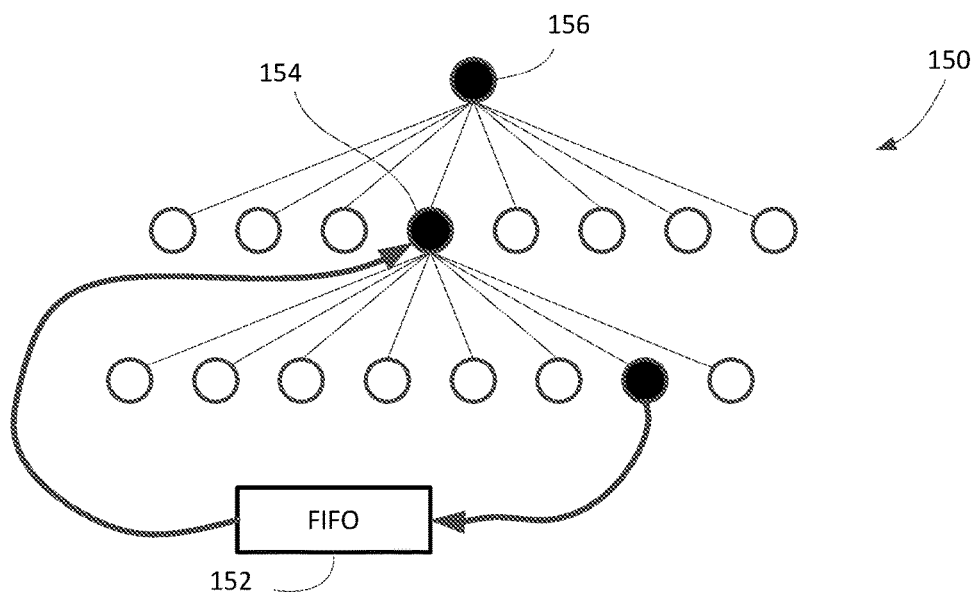
FIG. 4 illustrates the recursive splitting and coding of an octree.

Another example, which employs an occupied≡splitting condition, is shown in FIG. 4. FIG. 4 illustrates the recursive splitting and coding of an octree 150. Only a portion of the octree 150 is shown in the figure. A FIFO 152 is shown as processing the nodes for splitting to illustrate the breadth-first nature of the present process. The FIFO 152 outputs an occupied node 154 that was queued in the FIFO 152 for further splitting after processing of its parent node 156. The tree builder splits the sub-volume associated with the occupied node 154 into eight sub-volumes (cubes) and determines their occupancy. The occupancy may be indicated by an occupancy flag for each sub-volume. In a prescribed scan order, the flags may be referred to as the occupancy pattern for the node 154. The pattern may be specified by the integer representing the sequence of occupancy flags associated with the sub-volumes in the pre-defined scan order. In the case of an octree, the pattern is an integer in the range [1, 255].

The entropy encoder then encodes that pattern using a non-binary arithmetic encoder based on probabilities specified by the context model. In this example, the probabilities may be a pattern distribution based on an initial distribution model and adaptively updated. In one implementation, the pattern distribution is effectively a counter of the number of times each pattern (integer from 1 to 255) has been encountered during coding. The pattern distribution may be updated after each sub-volume is coded. The pattern distribution may be normalized, as needed, since the relative frequency of the patterns is germane to the probability assessment and not the absolute count.

Based on the pattern, those child nodes that are occupied (e.g. have a flag=1) are then pushed into the FIFO 152 for further splitting in turn (provided the nodes are not a maximum depth of the tree).

An octree representation, or more generally any tree representation, is efficient at representing points with a spatial correlation because trees tend to factorize the higher order bits of the point coordinates. For an octree, each level of depth refines the coordinates of points within a sub-volume by one bit for each component at a cost of eight bits per refinement. Further compression is obtained by entropy coding the split information, i.e. pattern, associated with each tree node. This further compression is possible because the pattern distribution is not uniform—non-uniformity being another consequence of the correlation.

Nevertheless, one of the problems with compressing point cloud data in a tree-structure is that it does not necessarily deal with isolated points very well. The recursive splitting of the sub-volume and the location of points within the split sub-volumes involves computational burden and time, and the signaling of recursive splitting of sub-volumes to pinpoint the location of one or a few isolated points can be costly in terms of bandwidths/memory storage, as well as computational time and resources. Furthermore, isolated points "pollute" the distribution of patterns, inducing many patterns with only one occupied child, thus changing the balance of the distribution and penalizing the coding of other patterns.

Accordingly, in one aspect, the present application proposes the direct coding of positional information for isolated points. The direct coding of a point's position, e.g. coordinates within a volume or sub-volume, may be termed Direct Coding Mode (DCM).

It would be highly inefficient to use DCM for all points. One option is to signal, for each occupied node, using a dedicated flag, whether DCM will be used for any points within that node; however, this option may result in excessive overhead cost in signaling, thereby producing worse compression performance.

Therefore, in accordance with another aspect of the present application, the eligibility to use DCM for an occupied node is determined based on occupancy information from other nodes. If the occupied node is eligible to use DCM, then a flag is inserted in the bitstream to signal whether DCM is applied or not.

Figure 5:
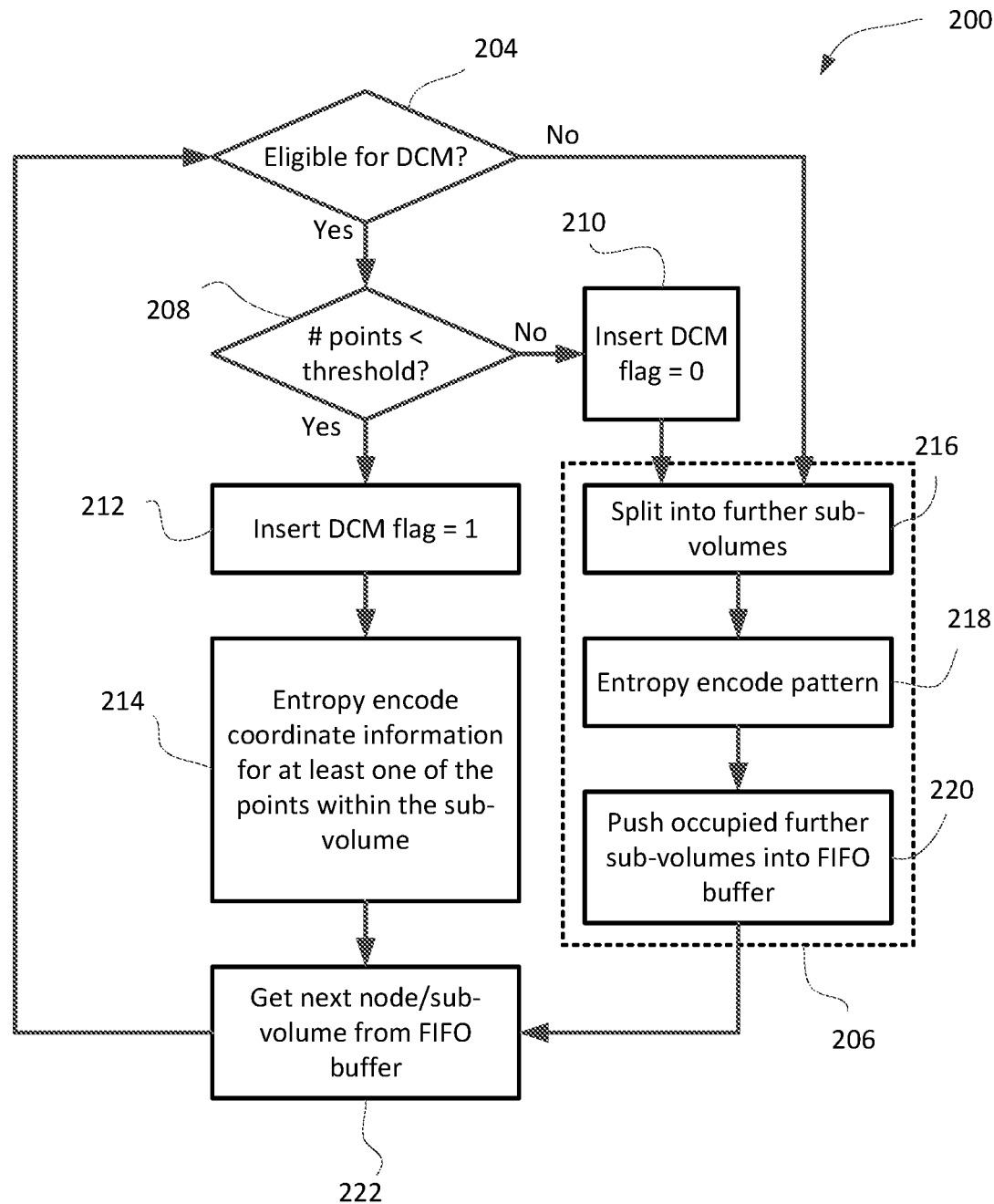
FIG. 5 shows, in flowchart form, one example method for encoding a point cloud.

Reference is now made to FIG. 5, which shows, in flowchart form, one example method 200 of encoding a point cloud. The method 200 in this example involves recursive splitting of occupied nodes (sub-volumes) and a breadth-first traversal of the tree for coding.

In operation 204, with regard to a current occupied node, e.g. a current sub-volume associated with a node of the tree occupied by at least one point, whether that sub-volume is eligible for DCM. If not, then in operation 206 the node is split and coded in accordance with the usual tree-coding process. That is, in at least this example, the sub-volume is split into child sub-volumes, as indicated by operation 216, and the pattern of occupancy of those child sub-volumes is entropy encoded in operation 218. In operation 220, any of those child sub-volumes that are occupied by at least one point are buffered to be further split/encoded (put in a FIFO buffer). Although not explicitly illustrated, it will be appreciated that the method 200 incorporates a stopping condition, like maximum tree depth, after which it will not further split the sub-volumes.

If, in operation 204, the node is evaluated and it is determined that the node is eligible for DCM, then in operation 208 the number of points contained with that sub-volume is assessed against a threshold. If the number of points in the sub-volume is less than the threshold, then DCM is used. If the number of point is equal to or greater than the threshold, then DCM is not used. The threshold is set in advance and may be hard coded or user determined. It may be communicated from encoder to decoder in header information. The threshold may be 2 or more. It will be appreciated that the evaluation may be modified to enable DCM if the number is less than or equal to the threshold, and the threshold may be set one point lower in that case to realize the same result. In any event, if DCM is not used, then in operation 210 a DCM flag set to negative (may be signaled as value 0 in some implementations) and is output in the bitstream to inform the decoder that DCM is not to be used in this sub-volume. The method 200 then loops to operation 206 to split and encode the sub-volume in the usual manner.

If DCM is to be used, then in operation 212 the DCM flag is set positive (which may be a value of 1 in some implementations) and in operation 214 at least some of the points within the sub-volume are encoded through encoding their coordinate positions within the sub-volume. This may include encoding X, Y and Z Cartesian coordinate positions relative to a corner of the sub-volume in some implementations. The corner may be the sub-volume vertex closest to the original of a coordinate system, for example. Various techniques for encoding coordinates may be applied, including prediction operations, differential coding, etc., depending on the implementation.

Operation 214 is described above as encoding at least some of the points rather than all of the points since, in some possible implementations, a rate-distortion optimization process may be applied to assess whether the rate cost of DCM coding a point exceeds the distortion cost of not coding the point. Note that if such an RD optimization evaluation impacts whether the parent node would have been "occupied", then the RD optimization may need to be performed earlier in the coding process and/or the process may involve two-pass coding.

Once the node has been encoded, either through use of DCM or through conventional encoding of the pattern, then the method 200 obtains the next occupied node/sub-volume from the FIFO buffer, as shown by operation 222, and cycled back to assess whether that node/sub-volume is eligible for DCM. As noted above, a stopping condition will eventually halt further sub-division of the sub-volumes and all nodes in the FIFO will have been processed.

Figure 6:
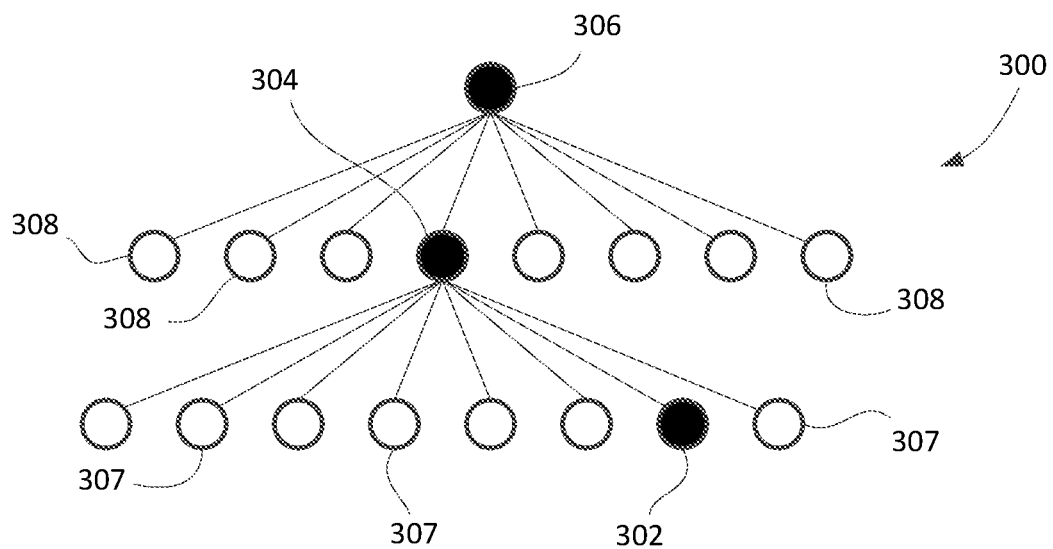
FIG. 6 illustrates a portion of an example octree.

The eligibility assessment in operation 204 is to be based on occupancy data for previously-coded nodes. This allows both the encoder and decoder to independently make the same determination of eligibility. For the below discussion of eligibility assessment, reference will be made to FIG. 6, which diagrammatically illustrates a partial octree 300, including a current node 302. The current node 302 is an occupied node and is being evaluated for coding. It is either going to be further split and its pattern encoded, or its going to have its points DCM encoded. The current node 302 is one of eight children of a parent node 304, which in turn is a child to a grand-parent node 306.

In one embodiment, the eligibility may be based on the parent pattern. That is, an eligibility criteria may be based on the occupancy status of the seven other nodes that are children to the parent node 304, i.e. the siblings 307 to the current node 302. For example, if none of the sibling 307 nodes are occupied, it may indicate that the current node 302 is isolated and is a good candidate for possible DCM coding.

Figure 7:
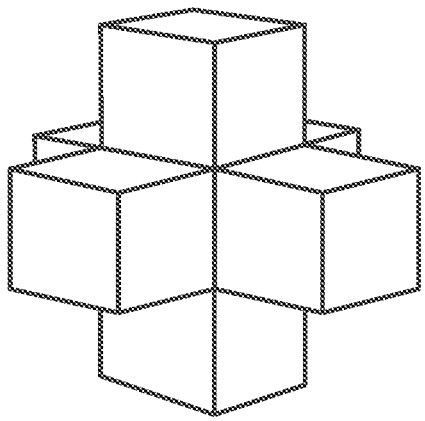
FIG. 7 shows an example of neighbouring sub-volumes.

In another embodiment, the eligibility may be based on neighboring nodes (sub-volumes). Two nodes are neighbouring, in some embodiments, if they are associated with respective sub-volumes that share at least one face. In a broader definition, nodes are neighboring if they share at least one edge. In yet a broader definition, two nodes are neighboring if they share at least one vertex. FIG. 7 illustrates a set of neighbors surrounding a current node, where neighbour is defined as nodes sharing a face. In this example, the nodes/sub-volumes are cubes and the cube at the center of the image has six neighbours, one for each face.

In an octree, it will be appreciated that neighbours to the current node 302 will include three sibling 307 nodes. It will also include three nodes that do not have the same parent node 304. Accordingly, some of the neighboring nodes will be available because they are siblings, but some neighbouring nodes may or may not be available, depending on whether those nodes were previously coded. Special handling may be applied to deal with missing neighbours. In some implementations, the missing neighbour may be presumed to be occupied or may be presumed to be unoccupied, depending on whether the process is biased toward DCM or not. It will be appreciated that the neighbour definition may be broadened to include neighbouring nodes based on a shared edge or based on a shared vertex to include additional adjacent sub-volumes in the assessment.

It will also be appreciated that assessing the immediate surrounding neighbourhood of the current node 302 based on the occupancy status of neighbouring nodes may be more accurate assessment of isolation than assessing the occupancy status of siblings, three of which will only share an edge and one of which will only share a vertex. However, the assessment of occupancy status of siblings has the advantage of being modular in that all the relevant data for the assessment is part of the parent node 304, meaning it has a smaller memory footprint for implementation, whereas assessment of neighbour occupancy status involves buffering tree occupancy data in case it is needed to perform an eligibility assessment for a future neighbouring node.

In some cases, the two above criteria may be both applied or may be selected between. For example, if neighbours are available then the eligibility assessment may be made based on the neighbouring nodes; however, if one or more of the neighbours are unavailable because they are from nodes not-yet coded, then the eligibility assessment may revert to an analysis based on sibling 307 nodes (parent pattern).

In yet another embodiment, the eligibility may be alternatively, or additionally, be based on the grandparent pattern. In other words, the eligibility may be based on the occupancy status of the uncle nodes 308 that are siblings to the parent node 304. If the parent node 304 is the only occupied node in the grandparent pattern, it may be a strong indication that the points of the node are isolated.

In yet further implementation, additional or alternative assessments may be factored into the eligibility assessment. For example, the assessment may look at the occupancy status of neighbour nodes to the parent node, or neighbour nodes to the grand-parent node.

Any two or more of the above criteria for assessing local occupancy status may be used in combination in some implementations.

The determination of eligibility based on any of the above assessments or combination of assessments may be based on all of the surrounding nodes being unoccupied. In some cases, it may be based on no more than a threshold number of surrounding nodes being unoccupied. The threshold may be set at one in some embodiments. Other thresholds for determining eligibility may be selected dependent on the extent to which DCM is desirable.

In the above examples, the decision to actually use DCM (as opposed to whether the node is simply eligible to use it) is based on the number of points in the node. As detailed above, the threshold number that marks the decision point between DCM and conventional splitting and pattern coding may be selected for a particular implementation. The threshold may be 1 point, 2 points, or any other suitable number for a particular application. In some cases, only a single point is permitted for DCM. In such a case, the number of points being coded need not be signaled in the bitstream, because the DCM flag being positive effectively tells the decoder that a single point is going to be DCM coded in the bitstream. If more than one point may be coded, then the bitstream contains the number of points. The number of points (if coded in the bitstream) may be signaled using any suitable coding mechanism.

The coordinates may also be coded using any suitable coding mechanism. For example, they may be direct by-pass encoded in some implementations. In some implementations, entropy coding may be used. The three coordinates may be coded independently, in some implementations. The number of bits required for the coordinates depends on the tree resolution and the depth of the sub-volume at which the DCM occurs. For example, if the current sub-volume is a cube of size $2^D$, then D bits may be used for each coordinate.

Figure 8:
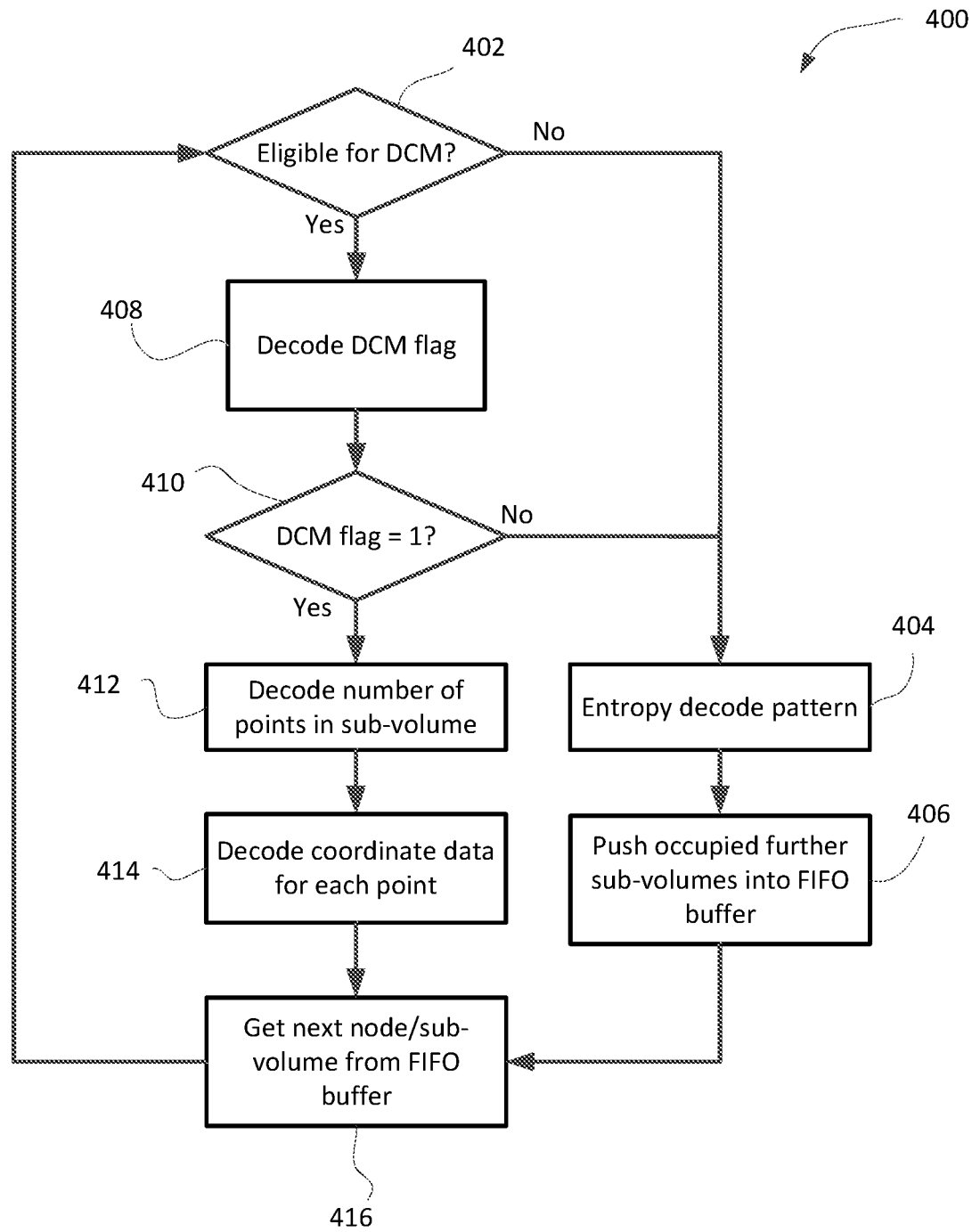
FIG. 8 shows, in flowchart form, one example method for decoding a bitstream of compressed point cloud data.

Reference is now made to FIG. 8, which shows, in flowchart form, one example method 400 for decoding a bitstream of encoded point cloud data.

In operation 402, the decoder evaluates whether a current occupied node of the tree of point cloud data is eligible for DCM. The decoder uses the same eligibility determination used by the encoder. In general, the eligibility determination is based on some occupancy data from sibling or neighbouring nodes, examples of which are described above.

If the node is not eligible, then the decoder splits the node and entropy decodes the pattern of occupancy in operation 404 and then pushes any occupied child nodes into the FIFO buffer in operation 406. However, if the node is eligible for DCM, then the decoder decodes the DCM flag in operation 408. The decoded DCM flag indicates whether or not DCM was actually used for encoding points in the current node, as shown by operation 410. In this example, a DCM flag value of 1 corresponds to use of DCM and a flag value of 0 corresponds to not using DCM. If the DCM flag indicates that DCM was not used, then the method 400 proceeds to operations 404 and 406 to decode the pattern as per usual. If the DCM flag indicates that DCM was used, then in operation 414 the decoder decodes the coordinate point data for any points in the node.

If the encoder and decoder are configured to use DCM in the case of more than one point per node, then in operation 412 the decoder decodes the number of points. It will be appreciated that this value may be encoded as the number less one since it is known that the value must be one or more. Once the decoder knows the quantity of encoded points, it then decodes the coordinate data for each of the points in operation 414.

After the decoder has either decoded the pattern or decoded the point coordinate data, it then gets, in operation 416, the next occupied node from the FIFO buffer and returns to operation 402 to assess its eligibility for DCM coding.

Example implementations of the above-described methods have proven to provide a negligible compression change but a significant decrease in coding complexity. The complexity is reduced because DCM is much less complex that octree splitting. The tree is naturally "pruned" by the DCM coding, resulting in about a 40% decrease in coding time in some testing. In testing, it was found that more significant compression performance improvement (measured as bits per point) may be realized when incorporating parent neighbours (uncle nodes) into the eligibility determination.

Some of the above examples are based on a tree coding process that uses the occupied-then-split principle. The DCM coding process may also be applied, with suitable modifications, to tree coding processes that rely on the split-then-occupied principle.

In one example implementation, rather than coding coordinate data for the points, the DCM coding may give coordinate data for a sub-volume at a level above the lowest resolution of the tree, and thereafter tree coding proceeds as per usual. This may be termed "skip-depth" DCM. In this implementation, a prescribed minimum number of tree depth levels to skip may be preset and the actual number being skipped may be signaled in the bitstream after assertion of the DCM flag. After the number of depth levels is signaled, the coordinates of the sub-volume at which to resume tree coding is encoded.

Figure 9:
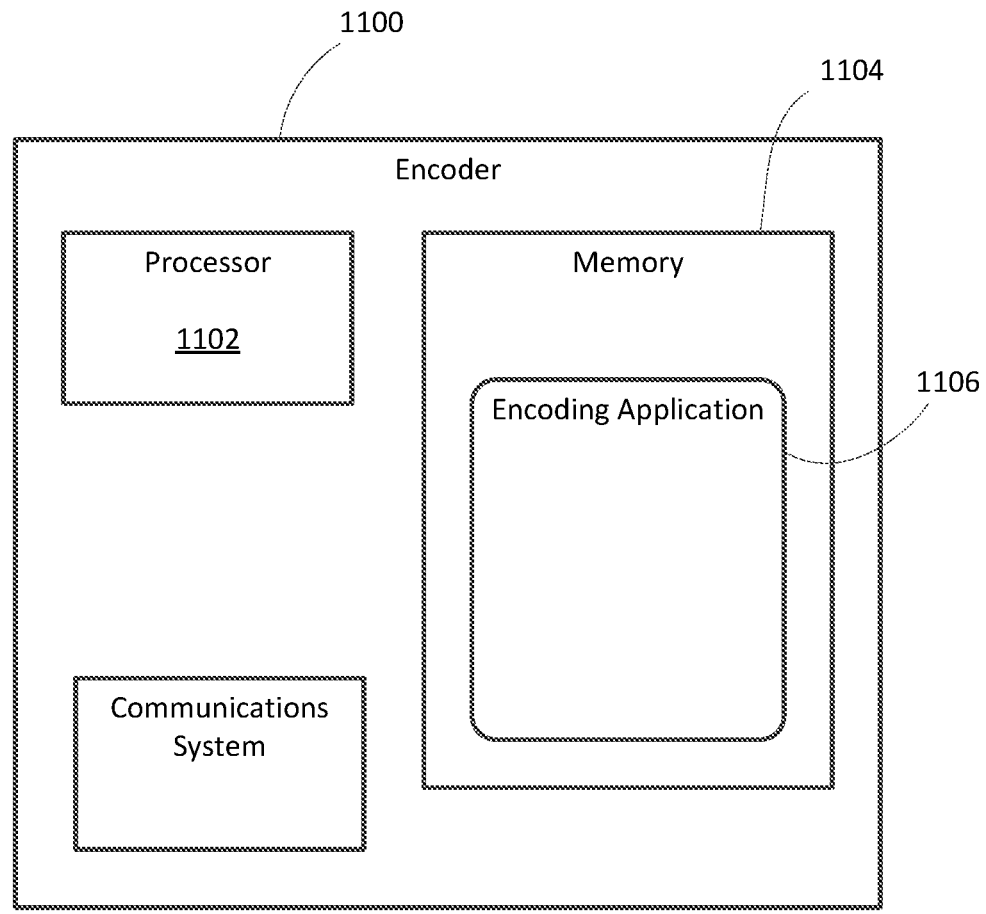
FIG. 9 shows an example simplified block diagram of an encoder.

Reference is now made to FIG. 9, which shows a simplified block diagram of an example embodiment of an encoder 1100. The encoder 1100 includes a processor 1102, memory 1104, and an encoding application 1106. The encoding application 1106 may include a computer program or application stored in memory 1104 and containing instructions that, when executed, cause the processor 1102 to perform operations such as those described herein. For example, the encoding application 1106 may encode and output bitstreams encoded in accordance with the processes described herein. It will be understood that the encoding application 1106 may be stored on a non-transitory computer-readable medium, such as a compact disc, flash memory device, random access memory, hard drive, etc. When the instructions are executed, the processor 1102 carries out the operations and functions specified in the instructions so as to operate as a special-purpose processor that implements the described process(es). Such a processor may be referred to as a "processor circuit" or "processor circuitry" in some examples.

Figure 10:
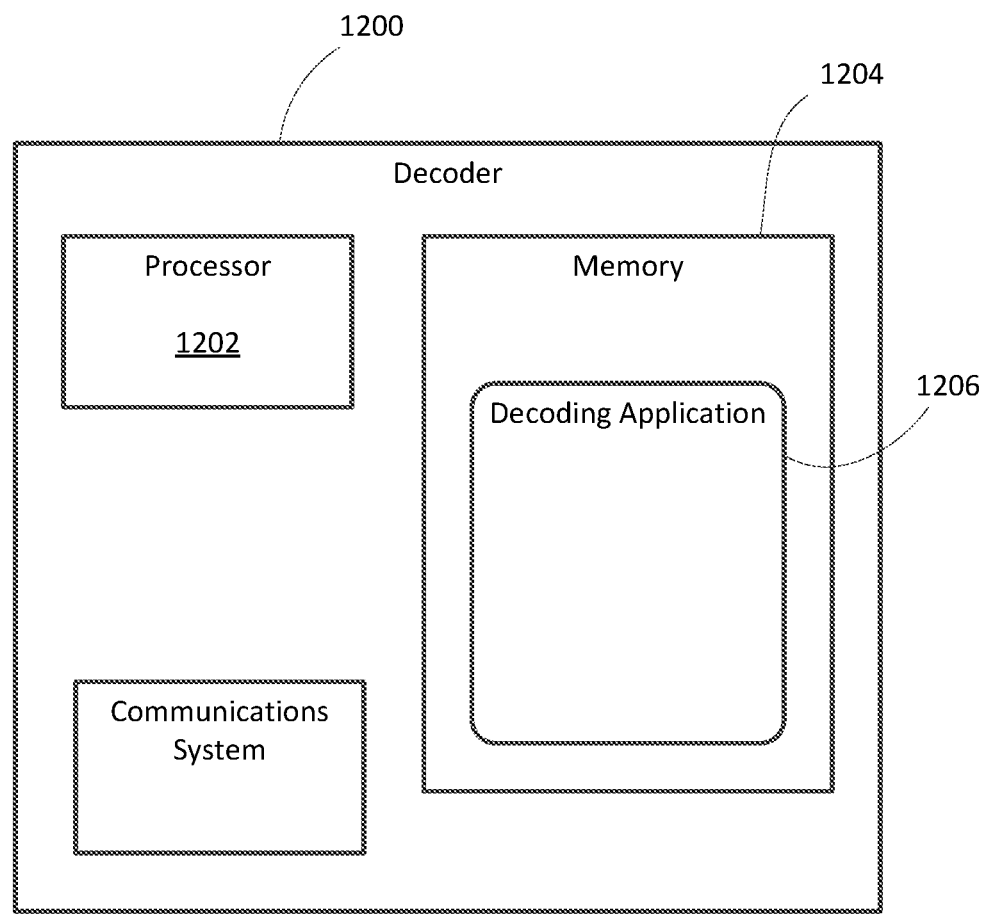
FIG. 10 shows an example simplified block diagram of a decoder.

Reference is now also made to FIG. 10, which shows a simplified block diagram of an example embodiment of a decoder 1200. The decoder 1200 includes a processor 1202, a memory 1204, and a decoding application 1206. The decoding application 1206 may include a computer program or application stored in memory 1204 and containing instructions that, when executed, cause the processor 1202 to perform operations such as those described herein. It will be understood that the decoding application 1206 may be stored on a computer-readable medium, such as a compact disc, flash memory device, random access memory, hard drive, etc. When the instructions are executed, the processor 1202 carries out the operations and functions specified in the instructions so as to operate as a special-purpose processor that implements the described process(es). Such a processor may be referred to as a "processor circuit" or "processor circuitry" in some examples.

It will be appreciated that the decoder and/or encoder according to the present application may be implemented in a number of computing devices, including, without limitation, servers, suitably-programmed general purpose computers, machine vision systems, and mobile devices. The decoder or encoder may be implemented by way of software containing instructions for configuring a processor or processors to carry out the functions described herein. The software instructions may be stored on any suitable non-transitory computer-readable memory, including CDs, RAM, ROM, Flash memory, etc.

It will be understood that the decoder and/or encoder described herein and the module, routine, process, thread, or other software component implementing the described method/process for configuring the encoder or decoder may be realized using standard computer programming techniques and languages. The present application is not limited to particular processors, computer languages, computer programming conventions, data structures, other such implementation details. Those skilled in the art will recognize that the described processes may be implemented as a part of computer-executable code stored in volatile or non-volatile memory, as part of an application-specific integrated chip (ASIC), etc.

The present application also provides for a computer-readable signal encoding the data produced through application of an encoding process in accordance with the present application.

Certain adaptations and modifications of the described embodiments can be made. Therefore, the above discussed embodiments are considered to be illustrative and not restrictive.

What is claimed is:

1. A method of encoding a point cloud to generate a bitstream of compressed point cloud data, the point cloud being defined in a tree structure having a plurality of nodes having parent-child relationships and that represent the geometry of a volumetric space recursively split into sub-volumes and containing the points of the point cloud, the method comprising:

traversing the tree to entropy encode patterns of occupancy for sets of child nodes, wherein a pattern of occupancy indicates which of the sub-volumes associated with the respective child nodes contain at least one point, and wherein the traversing includes:
   for a current node associated with a sub-volume, determining that points within the sub-volume associated with the current node are eligible for direct coding based on an occupancy pattern for a parent node to the current node;

inserting a flag in the bitstream indicating the direct coding is to be used to encode the current node; and entropy encoding positional coordinate data for at least one of the points within the sub-volume.

2. The method claimed in claim 1, wherein the occupancy pattern for the parent node includes whether sibling nodes to the current node are occupied.

3. The method claimed in claim 2, wherein the sibling nodes are nodes that are associated with respective sub-volumes of the parent node.

4. The method claimed in claim 3, wherein the respective sub-volumes of the parent node share at least one vertex with the sub-volume associated with the current node.

5. The method claimed in claim 2, wherein determining eligibility based on the occupancy pattern for the parent node to the current node includes determining that none of the sibling nodes are occupied.

6. The method claimed in claim 1, further comprising, for a second node that is associated with a second sub-volume, determining that points within the second sub-volume associated with the second node are not eligible for direct coding based on a parent occupancy pattern for a parent to the second node; and entropy encoding occupancy data for the second sub-volume without direct coding.

7. An encoder for encoding a point cloud to generate a bitstream of compressed point cloud data, the point cloud being defined in a tree structure having a plurality of nodes having parent-child relationships and that represent the geometry of a volumetric space recursively split into sub-volumes and containing the points of the point cloud, the encoder comprising:

a processor;

memory; and an encoding application containing instructions executable by the processor that, when executed, are to cause the processor to:

traverse the tree to entropy encode patterns of occupancy for sets of child nodes, wherein a pattern of occupancy indicates which of the sub-volumes associated with the respective child nodes contain at least one point, and wherein the traversing includes:

for a current node associated with a sub-volume, the processor is to:

determine that points within the sub-volume associated with the current node are eligible for direct coding based on an occupancy pattern for a parent node to the current node;

insert a flag in the bitstream indicating the direct coding is to be used to encode the current node; and entropy encode positional coordinate data for at least one of the points within the sub-volume.

8. The encoder claimed in claim 7, wherein the occupancy pattern for the parent node includes whether sibling nodes to the current node are occupied.

9. The encoder claimed in claim 8, wherein the sibling nodes are nodes that are associated with respective sub-volumes of the parent node.

10. The encoder claimed in claim 9, wherein the respective sub-volumes of the parent node share at least one vertex with the sub-volume associated with the current node.

11. The encoder claimed in claim 8, wherein the instructions, when executed, are to cause the processor to determine eligibility based on the occupancy pattern for the parent node to the current node by determining that none of the sibling nodes are occupied.

12. The encoder claimed in claim 7, wherein the instructions, when executed, are to further cause the processor to, for a second node that is associated with a second sub-volume, determine that points within the second sub-volume associated with the second node are not eligible for direct coding based on a parent occupancy pattern for a parent to the second node; and entropy encode occupancy data for the second sub-volume without direct coding.

13. A non-transitory computer readable medium storing processor-readable instructions for encoding a point cloud to generate a bitstream of compressed point cloud data, the point cloud being defined in a tree structure having a plurality of nodes having parent-child relationships and that represent the geometry of a volumetric space recursively split into sub-volumes and containing the points of the point cloud, wherein the instructions, when executed, are to cause a processor to:

traverse the tree to entropy encode patterns of occupancy for sets of child nodes, wherein a pattern of occupancy indicates which of the sub-volumes associated with the respective child nodes contain at least one point, and wherein the traversing includes:

for a current node associated with a sub-volume, the processor is to:

determine that points within the sub-volume associated with the current node are eligible for direct coding based on an occupancy pattern for a parent node to the current node;

insert a flag in the bitstream indicating the direct coding is to be used to encode the current node; and entropy encode positional coordinate data for at least one of the points within the sub-volume.

14. The non-transitory computer readable medium claimed in claim 13, wherein the occupancy pattern for the parent node includes whether sibling nodes to the current node are occupied.

15. The non-transitory computer readable medium claimed in claim 14, wherein the sibling nodes are nodes that are associated with respective sub-volumes of the parent node.

16. The non-transitory computer readable medium claimed in claim 15, wherein the respective sub-volumes of the parent node share at least one vertex with the sub-volume associated with the current node.

17. The non-transitory computer readable medium claimed in claim 14, wherein the instructions, when executed, are to cause the processor to determine eligibility based on the occupancy pattern for the parent node to the current node by determining that none of the sibling nodes are occupied.

18. The non-transitory computer readable medium claimed in claim 13, wherein the instructions, when executed, are to further cause the processor to, for a second node that is associated with a second sub-volume, determine that points within the second sub-volume associated with the second node are not eligible for direct coding based on a parent occupancy pattern for a parent to the second node; and entropy encode occupancy data for the second sub-volume without direct coding.

* * * * *